(12) United States Patent
Yoshikawa et al.

(10) Patent No.: US 7,088,568 B2
(45) Date of Patent: Aug. 8, 2006

(54) METHOD FOR MANUFACTURE OF MULTILAYER CERAMIC SUBSTRATE AND MULTILAYER CERAMIC SUBSTRATE

(75) Inventors: Hideki Yoshikawa, Takarazuka (JP); Hiroshi Nonoue, Hirakata (JP); Kenichiro Wakisaka, Iga (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/082,970

(22) Filed: Mar. 18, 2005

(65) Prior Publication Data

US 2005/0219774 A1   Oct. 6, 2005

(30) Foreign Application Priority Data

Mar. 31, 2004 (JP) .............................. 2004-103929

(51) Int. Cl.
  *H01G 4/005* (2006.01)
  *H01G 4/06* (2006.01)
  *C03B 29/00* (2006.01)

(52) U.S. Cl. .................. 361/303; 361/311; 361/301.4; 156/89.12

(58) Field of Classification Search ........ 361/311–313, 361/301.4, 303–305, 761–763; 156/89.12
See application file for complete search history.

(56) References Cited

U.S. PATENT DOCUMENTS

| 6,104,599 A * | 8/2000 | Ahiko et al. .............. 361/306.3 |
| 6,438,827 B1 * | 8/2002 | Nakagawa et al. ........... 29/860 |
| 2003/0230374 A1 * | 12/2003 | Yamana et al. .......... 156/89.12 |

FOREIGN PATENT DOCUMENTS

| JP | 08-288643 | 11/1996 |
| JP | 10-150269 | 6/1998 |
| JP | 11-049531 | 2/1999 |
| JP | 2001-339166 | 12/2001 |

* cited by examiner

*Primary Examiner*—Eric W. Thomas
(74) *Attorney, Agent, or Firm*—McDermott Will & Emery LLP (57) ABSTRACT

A method for manufacturing a multilayer ceramic substrate including the steps of providing multilayers of ceramic green sheets each having an electrode layer formed on a dielectric layer such that, after firing, at least one electrode layer which is separated by the dielectric layer from the adjacent electrode layer in the substrate has an overlapping area of 0.4 mm$^2$ or smaller with the adjacent electrode; and firing the multilayers of the ceramic green sheets at a selected temperature such that, after firing, an interface between the dielectric layer and the electrode layer in the substrate has irregularities with a roughness Rmax of 6 μm or less per 100 μm standard length and the dielectric layer has a saturation sintered density.

6 Claims, 7 Drawing Sheets

METHOD FOR MANUFACTURE OF MULTILAYER CERAMIC SUBSTRATE AND MULTILAYER CERAMIC SUBSTRATE

The priority Japanese Patent Application Number 2004-103929 upon which this patent application is based is hereby incorporated by reference.

BACKGROUND OF THE INVENTION

1. Field of the Invention

The present invention relates to a method for manufacture of a multilayer ceramic substrate which is applicable for use in mobile communication terminals such as portable phones, and also to a multilayer ceramic substrate.

2. Description of Related Art

With the need of miniaturizing recently spread mobile communication equipment, such as portable phones, and portable communication terminals, the size reduction and performance increase of high-frequency circuit parts for use therein have been pursued.

In high-frequency circuit substrates, a conventional module including a printed substrate and a capacitor or inductor mounted on its surface has been increasingly replaced by a smaller size module consisting of multilayers of dielectric ceramic substrates each patterned with a capacitor or inductor circuit.

The multilayer ceramic substrate is generally fabricated by providing multilayers of green sheets, such as glass-ceramics, each carrying a predetermined circuit pattern formed by screen printing or the like, and firing them at a temperature of about 900° C. A popular material used for the circuit pattern is silver (Ag) which is highly conductive and air-firable.

However, due to a higher tendency of silver to exhibit a migration phenomenon, short circuit defect often occurs between silver wiring electrodes separated by a dielectric layer, which has been a problem.

Japanese Patent Laying-Open No. Hei 11-49531 describes that inclusion of CuO in a glass component of a glass-ceramic for use in a dielectric layer suppresses ionization of Ag during a firing process and thus restrains diffusion of Ag into the glass-ceramic.

In Japanese Patent Laying-Open No. Hei 8-288643, a surface roughness Ra of an insulating base, to which a wiring conductor is adhered, is specified as being in the range of 0.2–0.7 μm. This is contemplated to strengthen a joint between the insulating base and the wiring conductor in a three-dimensional fashion.

Japanese Patent Laying-Open No. 2001-339166 describes a wiring board which includes an insulating base composed of a glass-ceramic and a wired circuit layer formed on a surface or internally of the insulating base and proposes that a surface of the wired circuit layer on the insulating base, opposite to its surface in contact with the insulating base, should have a surface roughness Rz of 1–8 μm. This is described to permit a constraining sheet to constrain the wiring board more evenly so that shrinkage thereof during a firing process is restrained more effectively.

SUMMARY OF THE INVENTION

It is an object of the present invention to provide a method for manufacture of a multilayer ceramic substrate, which can reduce the occurrence of short circuit defect due to migration of an electrode layer made of silver, and also to provide a multilayer ceramic substrate which can be obtained by the practice of the above manufacturing method.

The present invention provides a method for manufacturing a multilayer ceramic substrate by firing multilayers of ceramic green sheets each having a dielectric layer made of a glass-ceramic material and an electrode layer made of silver and formed on the dielectric layer. Characteristically, the method includes a step wherein multilayers of ceramic green sheets each having an electrode layer formed on the dielectric layer are provided such that, after firing, at least one electrode layer which is separated by the dielectric layer from the adjacent electrode layer in the substrate has an overlapping area of 0.4 mm$^2$ or smaller with the adjacent electrode. The method further includes a step wherein the multilayers of the ceramic green sheets are fired at a selected temperature such that, after firing, an interface between the dielectric layer and the electrode layer in the substrate has irregularities with a roughness Rmax of 6 μm or less per 100 μm standard length and the dielectric layer has a saturation sintered density.

The inventors of this application have found that, in a multilayer ceramic substrate obtained through firing, if an electrode layer separated by a dielectric layer from an adjacent electrode layer has an overlapping area of 0.4 mm$^2$ or smaller with the adjacent electrode, there is an increasing tendency of silver in the electrode layer to migrate. They have also found that, in a multilayer ceramic substrate obtained through firing, if a roughness Rmax in irregularities of an interface between the dielectric layer and the electrode layer exceeds 6 μm per 100 μm standard length, the occurrence of migration of silver in the electrode layer increases. Also, the roughness Rmax of such an irregular interface has been found to depend on the temperature and humidity, under which the green sheets are fired, and the viscosity of an Ag paste. That is, the roughness Rmax in irregularities of an interface between the dielectric layer and the electrode layer, in a multilayer ceramic substrate obtained through firing, can be reduced to 6 μm or less per 100 μm standard length by controlling the temperature and moisture, under which the multilayers of ceramic green sheets are fired, and the viscosity of the Ag paste which ends up in the electrode, in accordance with the present invention. As a result, the occurrence of migration can be effectively prevented in the multilayer ceramic substrate including the electrode layer which has the overlapping area of 0.4 mm$^2$ or smaller.

Therefore, a multilayer ceramic substrate which shows a reduced occurrence of short circuit defect due to migration of the silver electrode layer can be provided by the practice of the manufacturing method of the present invention.

The roughness Rmax in irregularities of an interface between the dielectric layer and the electrode layer, as described in the present invention, corresponds to the surface roughness Rmax defined in Japanese Industrial Standards (JIS B 0601). That is, it represents a vertical distance between a line parallel to a centerline of a roughness curve of the irregular interface and tangential to a peak (projection) of the irregular portion and a line parallel to the centerline and tangential to a valley (recess) of the irregular portion.

A sintered density of the dielectric layer generally increases with the firing temperature and goes to saturation when the firing temperature arrives at and exceeds a certain temperature. Within the saturation range, a sintered density variation of the dielectric layer is maintained within ±0.2%. In the present invention, the multilayers of the ceramic green sheets are fired at a temperature selected from the range that equals to or exceeds the certain temperature.

Also, the present invention specifies that, after firing, at least one electrode layer separated by a dielectric layer from an adjacent electrode layer has an overlapping area of 0.4 mm² or smaller. This is because migration often occurs in the electrode having an overlapping area of 0.4 mm² or smaller. When firing is effected properly in accordance with the present invention, an interface between the dielectric layer and the electrode layer in the substrate has irregularities with a roughness Rmax within 6 μm per 100 μm standard length. Then, the occurrence of migration can be prevented even in the electrode layer having an overlapping area of 0.4 mm² or smaller.

The thickness of the dielectric layer in the present invention is not particularly specified. However, it is generally preferred that the dielectric layer after firing has a thickness of about 20 μm–about 70 μm. Also, the thickness of the electrode layer is not particularly specified in the present invention. However, after firing, the electrode layer in the substrate generally has a thickness within the range of 5 μm–10 μm.

The multilayer ceramic substrate of the present invention is obtained by firing multilayers of ceramic green sheets each having a dielectric layer made of a glass-ceramic material and an electrode layer made of silver and formed on the dielectric layer. Characteristically, an interface between the dielectric layer and the electrode layer has irregularities with a roughness Rmax of up to 6 μm per 100 μm standard length and at least one electrode layer separated by the dielectric layer from the adjacent electrode layer has an overlapping area of 0.4 mm² or smaller.

In accordance with the present invention, the occurrence of migration of the electrode layer can be prevented even if having an overlapping area of 0.4 mm² or smaller. Accordingly, the occurrence of short circuit defect can also be prevented. The roughness Rmax of interface irregularities in a region of the electrode layer that has an overlapping area of 0.4 mm² or smaller may differ from that in the other regions of the electrode layer, so long as the roughness Rmax of interface irregularities in the region of the electrode layer that has an overlapping area of 0.4 mm² or smaller is 6 μm or less per 100 μm standard length.

In accordance with the present invention, the occurrence of short circuit defect due to migration of the silver electrode layer can be reduced.

DESCRIPTION OF THE PREFERRED EXAMPLES

The following embodiments and examples illustrate the present invention but are not intended to be limiting thereof.

Figure 2:
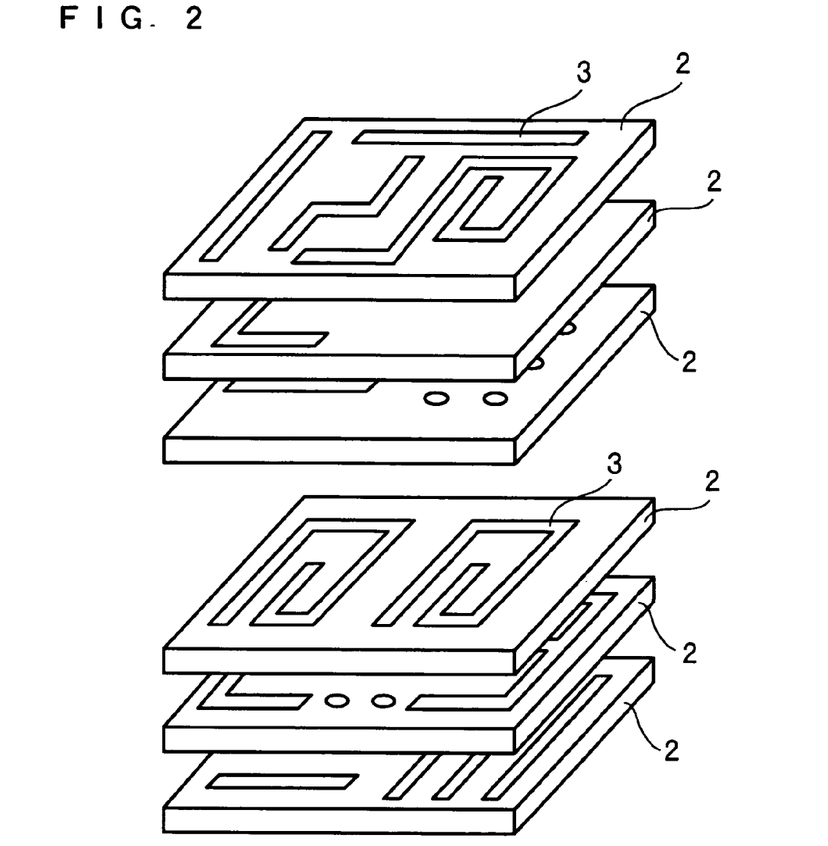
FIG. 2 is an exploded perspective view, showing an embodiment of a multilayer ceramic substrate in accordance with the present invention.
Figure 3:
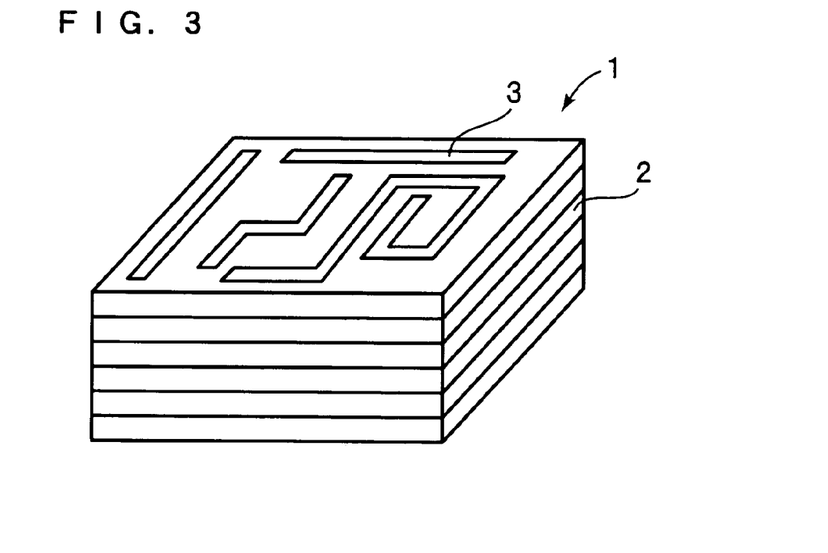
FIG. 3 is a perspective view, showing an embodiment of a multilayer ceramic substrate in accordance with the present invention.

FIGS. 2 and 3 are an explode perspective view and a perspective view, respectively showing one embodiment of a multilayer ceramic substrate of the present invention. As shown in FIG. 2, an electrode layer 3 composed of silver is formed on a dielectric layer 2. Stacking and subsequent firing of such dielectric layers 2 results in obtaining a multilayer ceramic substrate 1 as shown in FIG. 3. An inductor or a capacitor, according to a circuit pattern of the electrode layer 3, is provided internally of the multilayer ceramic substrate 1.

Figure 4:
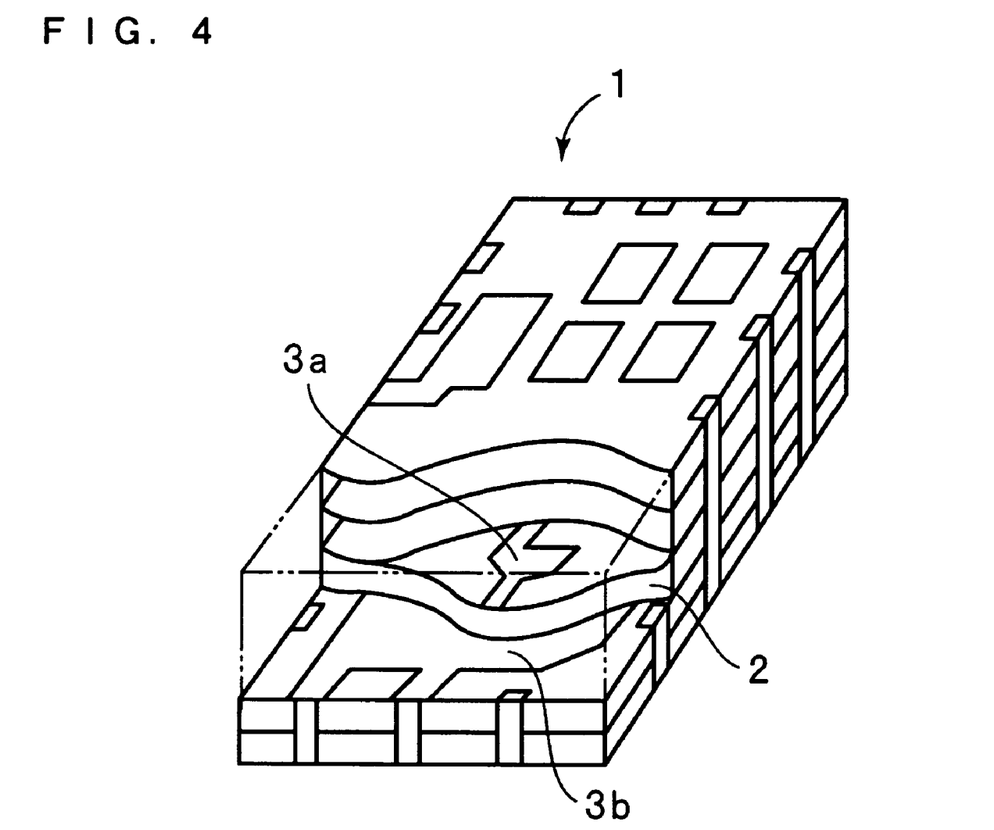
FIG. 4 is a partly cut-away perspective view, showing an embodiment of a multilayer ceramic substrate in accordance with the present invention.

FIG. 4 is a partly cut-away perspective view of the multilayer ceramic substrate. As shown in FIG. 4, in the multilayer ceramic substrate 1, the neighboring electrode layers 3a and 3b are separated by the dielectric layer 2.

Figure 5:
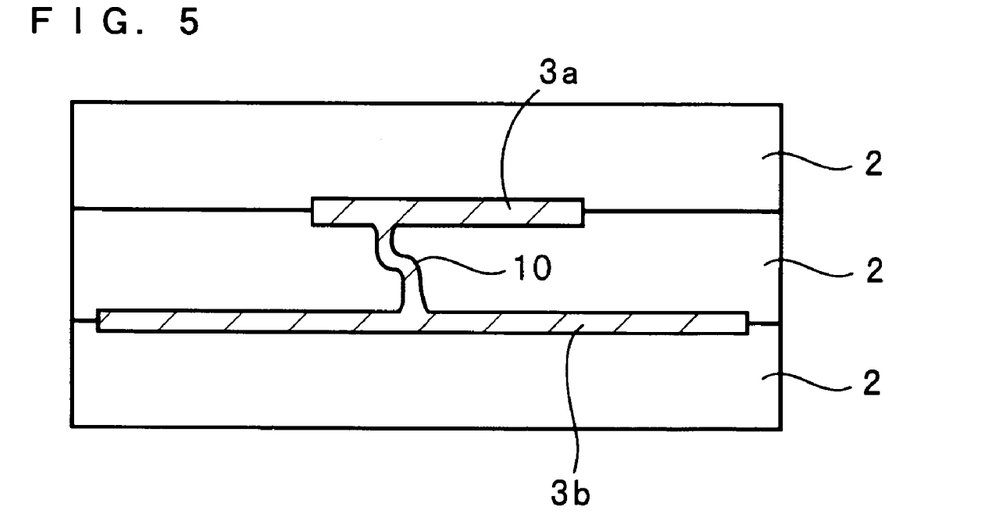
FIG. 5 is a sectional view which explains migration of an electrode layer.

FIG. 5 is a sectional view which explains migration of the electrode layer. Application of a voltage across the electrode layers 3a and 3b separated by the dielectric layer 2 causes silver in the electrode layers 3a and 3b to diffuse into the dielectric layer 2, resulting in the occurrence of migration 10. If the migration 10 connects with the neighboring electrode layer or with a silver portion that migrates therefrom, short circuit occurs between the electrode layers 3a and 3b.

Figure 6:
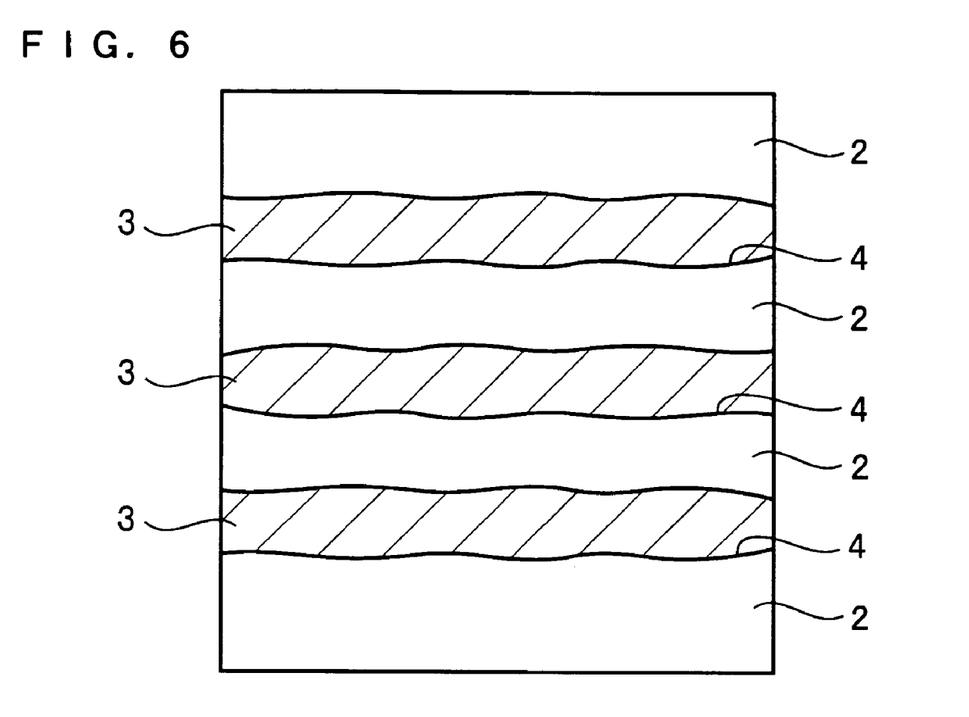
FIG. 6 is a sectional view, showing an embodiment of a multilayer ceramic substrate in accordance with the present invention.

FIG. 6 is a sectional view, showing an embodiment of a multilayer ceramic substrate in accordance with the present invention.

Figure 7:
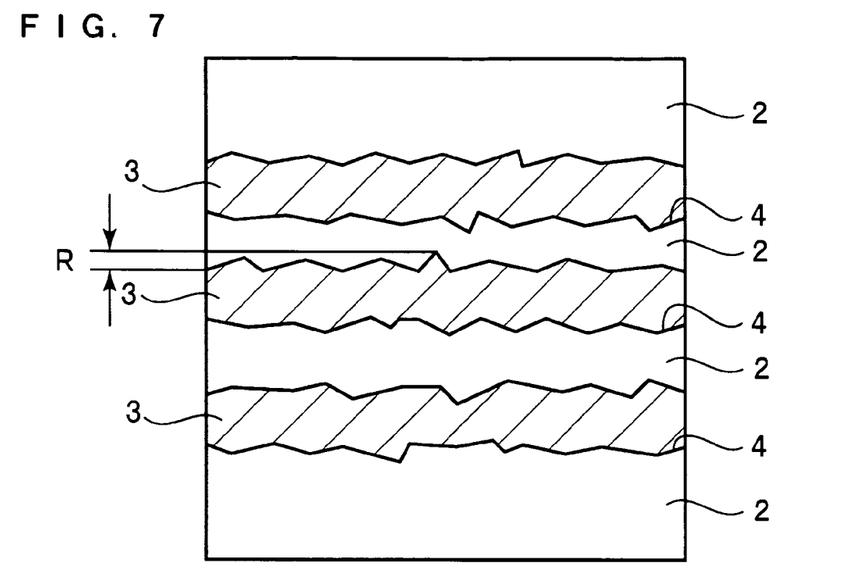
FIG. 7 is a sectional view, showing an example of a conventional multilayer ceramic substrate.

FIG. 7 is a sectional view, showing an example of a conventional multilayer ceramic substrate. As shown in FIGS. 6 and 7, an interface 4 is defined between the dielectric layer 2 and the electrode layer 3. In the multilayer ceramic substrate in accordance with the present invention, the interface 4 has small irregularities with a roughness Rmax of up to 6 μm per 100 μm standard length, as shown in FIG. 6. On the other hand, in the conventional ceramic substrate, the interface has large irregularities with a roughness Rmax of greater than 6 μm per 100 μm standard length, as shown in FIG. 7.

Figure 8:
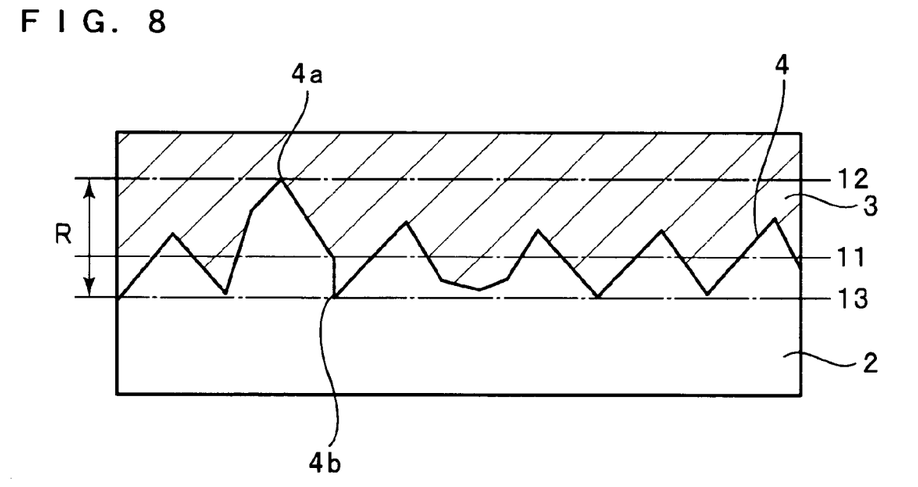
FIG. 8 is a sectional view which explains a roughness Rmax in irregularities of an interface between a dielectric layer and an electrode layer.

FIG. 8 is a sectional view which explains a roughness Rmax in irregularities of the interface 4 between the dielectric layer 2 and the electrode layer 3. First, a centerline 11 is drawn which passes through irregularities of the interface 4. The centerline 11 is determined such that a total area of projections above the centerline 11 equals a total area of recesses below the centerline 11. Also, a line 12 is drawn parallel to the centerline 11 and passing through a peak (projection) 4a in the irregularities 4. Further, a line 13 is drawn parallel to the centerline and passing through a valley (recess) 4b in the irregularities 4. A vertical distance between those lines 12 and 13 denotes the roughness Rmax of irregularities in the present invention. The roughness of the interface irregularities 4 is determined in a planar standard length of 100 μm.

In this invention, the roughness Rmax in irregularities of the interface between the dielectric layer and electrode layer 5 can be determined in accordance with the procedure as described above. Specifically, a section of the multilayer ceramic substrate is photographed as by a metallographic microscope and the roughness is measured using the obtained photomicrograph.

Figure 9:
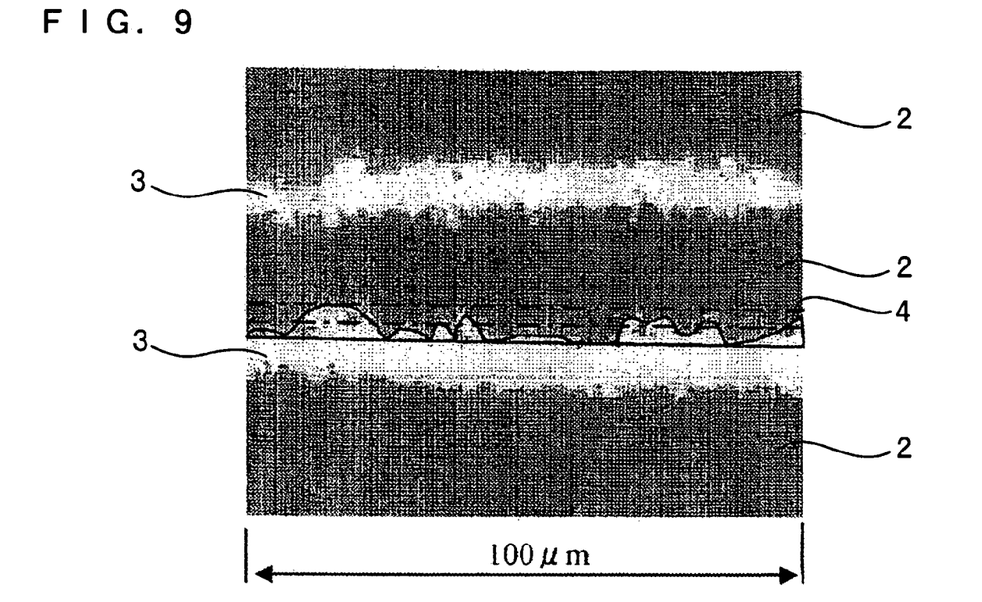
FIG. 9 is a sectional view of a multilayer ceramic substrate.

FIG. 9 is a photograph taken through a metallographic microscope, showing a section of the multilayer ceramic substrate. Using the photomicrograph, the irregularities of the interface between the dielectric layer and electrode layer within a region encompassing a 100 μm standard length is traced.

Figure 10:
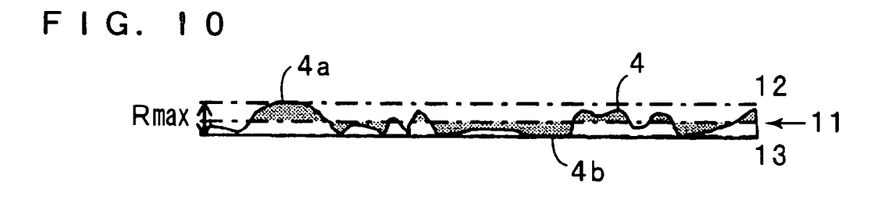
FIG. 10 is a view which explains a procedure for determining a roughness Rmax in irregularities of an interface between a dielectric layer and an electrode layer.

As shown in FIG. 10, a centerline 11 is then drawn on the traced irregularities 4 in accordance with the procedure as described above with reference to FIG. 8. Subsequently, lines 12 and 13 passing through a peak 4a and a valley 4b in the irregularities 4 are drawn. Finally, a vertical distance between the lines 12 and 13 is measured to give a value for Rmax.

Figure 11:
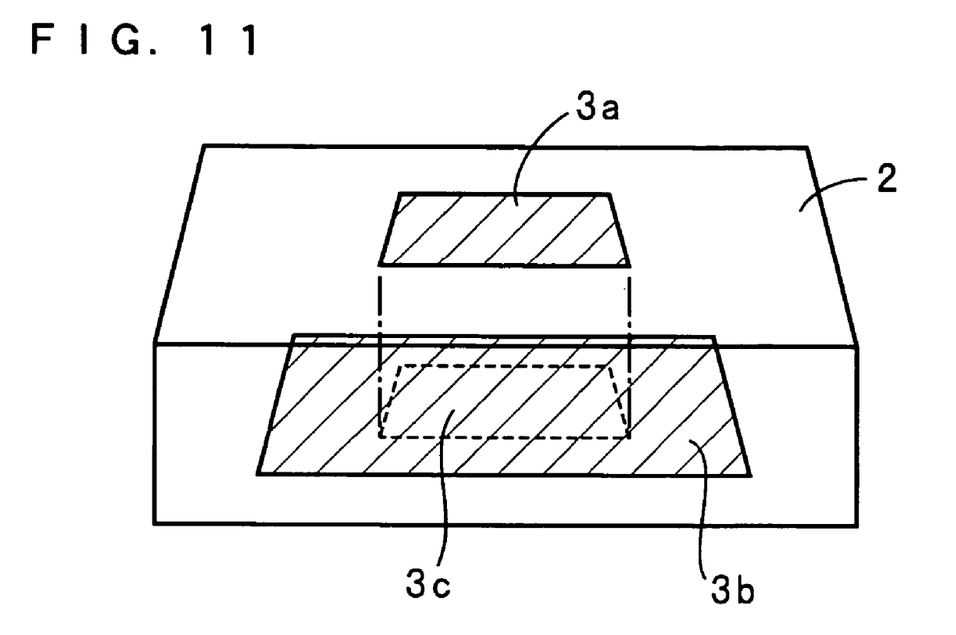
FIG. 11 is a perspective view which explains an overlapping area of an electrode layer.

FIG. 11 is a perspective view which explains an overlapping area of the electrode layer. As shown in FIG. 11, the electrode layer 3a and the electrode layer 3b are separated by the dielectric layer 2. The projected area 3c of the electrode layer 3a on the electrode layer 3b is referred to as the overlapping area.

EXAMPLE 1

A glass-ceramic material comprising alumina and borosilicate glass was used to form green sheets. A wiring pattern of silver was screen printed on each green sheet. These green sheets were staked in pile, as shown in FIG. 2, and then fired at a selected temperature to form a multilayer ceramic substrate. The glass-ceramic material for use in dielectric layers had a composition containing 44–52% by weight of $Al_2O_3$, 33–40% by weight of $SiO_2$, 8.0–13.0% by weight of CaO and 1.0–3.0% by weight of $K_2O$. After firing, the dielectric layers in the substrate had an average thickness of 30 μm and the electrode layers had an average thickness of 10 μm.

The above glass-ceramic material is recommended to be fired generally at 880° C. In this Example, firing was performed at 880° C., 860° C., 850° C., 840° C., 820° C. and 800° C. The obtained samples were designated as A–F.

For these samples A–F, roughness Rmax in irregularities of the interface between the dielectric layer and the electrode layer was measured in accordance with the procedure as described above, i.e., by utilizing a photomicrograph taken using a metallographic microscope, which shows a section of the multilayer ceramic substrate.

Also, a ratio Δ D of sintered densities was determined. The ratio Δ D is calculated from the following equation:

$$\Delta D = D2/D1$$

where, D1 is a sintered density of the glass-ceramic material when fired at a standard firing temperature of 880° C. (resulting in a crystallinity of 25%) and D2 is a sintered density of each sample. The crystallinity, as used herein, is given by I (glass)/I (alumina), which is a ratio in intensity of main peaks for the glass component and the ceramic component, alumina, in the glass-ceramic material under X-ray diffraction analysis.

For determination of sintered densities D1 and D2 for each sample, the glass-ceramic material was fired under the same conditions as used in obtaining the sample to prepare a sample having the shape of a rectangular parallelepiped, this sample was measured for volume and weight, and then weight/volume was calculated.

The sintered density of the glass-ceramic material when fired at a standard firing temperature of 880° C. was about 2.9 $g/cm^2$.

After firing, the resulting multilayer ceramic substrate was observed for short circuit defect due to migration in its regions where the electrodes had an overlapping area of 0.4 $mm^2$ or smaller.

The following procedure was utilized to evaluate the roughness Rmax of the interface and examine the occurrence of migration.

Among the samples obtained, those which were prepared under identical conditions were collected as a batch. At least one sample was taken from each batch and its section observed. This section was prepared by cutting or polishing the substrate at a particular position such that neighboring electrodes separated by the glass-ceramic layer were exposed to an outside.

By observing the section, Rmax was determined at the interface of the Ag electrode. Also, for a lot from which the sample was taken, an incidence of migration occurrence was calculated from (number of samples resulting in short circuit)/(number of samples tested). Specifically, the selected two neighboring electrodes within the multilayer ceramic were electrically connected to two terminals at the surface layer by respective vias through the substrate. Then, a resistance between the two terminals was detected by a tester to examine the occurrence of short circuit.

The roughness Rmax at the interface of the electrode can be adjusted to a desired level by controlling the manufacturing conditions of the multilayer ceramic substrate, including an atmosphere under which firing is performed, a viscosity of an Ag paste which is printed to form a wiring, and a firing temperature.

In order to study the influence of the humidity at which firing is performed and the viscosity of the Ag paste, samples G–I were prepared. In the preparation of the sample G, firing was performed in a humidity of up to 20% at room temperature. In the preparation of the sample H, the Ag paste having a viscosity of 250 Pas was used.

The measurement results for each sample are listed in Table 1. Also, interface roughness Rmax and Δ D, as both related to the firing temperature, are shown in FIG. 1.

TABLE 1

| | Firing Temperature (° C.) | Humidity (%) | Viscosity of Ag Paste (Pas) | Rmax (μm) | ΔD (%) | Incidence of Migration Occurrence |
|---|---|---|---|---|---|---|
| Sample A | 880 | 60 | 320 | 15.0 | 98.0 | 15%(18/120) |
| Sample B | 860 | 60 | 320 | 6.0 | 98.0 | 2%(8/408) |
| Sample C | 850 | 60 | 320 | 5.8 | 98.0 | 0%(0/300) |
| Sample D | 840 | 60 | 320 | 4.2 | 100.0 | 0%(1/420) |
| Sample E | 820 | 60 | 320 | 4.0 | 100.0 | 0%(1/120) |
| Sample F | 800 | 60 | 320 | — | 92.0 | — |
| Sample G | 862 | Below 20 | 320 | 10.0 | 98.0 | 6%(7/43) |
| Sample H | 862 | 60 | 250 | 10.0 | 98.0 | 3%(2/15) |
| Sample I | 862 | 60 | 320 | 6.0 | 98.0 | 5%(6/115) |

Figure 1:
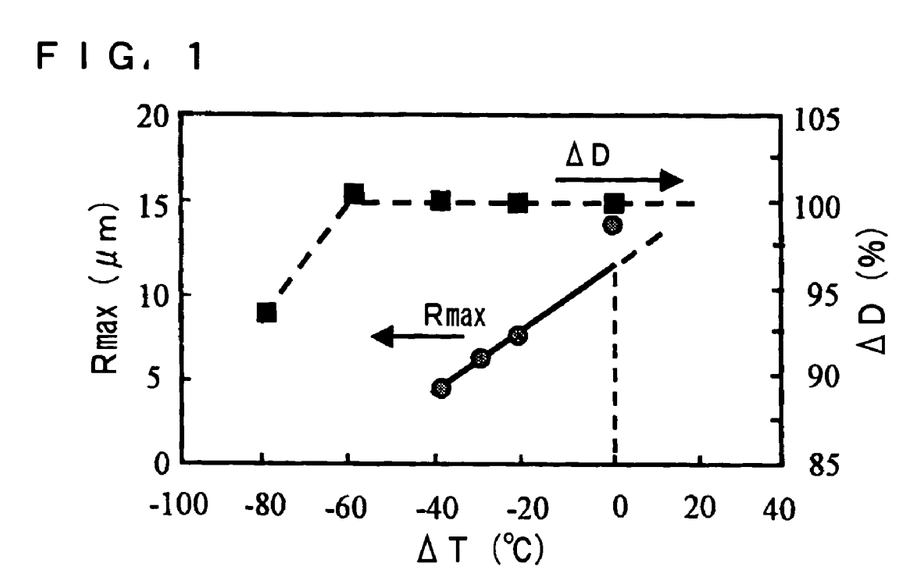
FIG. 1 is a graph which shows a roughness Rmax in irregularities of an interface between a dielectric layer and an electrode layer and a sintering density of the dielectric layer, as related to a firing temperature in the manufacture of a multilayer ceramic substrate.

As can be clearly seen from Table 1 and FIG. 1, when the firing temperature reaches and exceeds 820° C., the sintered density substantially goes to saturation. In the 820° C.–880° C. firing temperature range where the sintered density is kept substantially constant, a higher firing temperature increases a roughness Rmax in irregularities of the interface. As can also be appreciated, the occurrence of migration is reduced when the roughness Rmax in irregularities of the interface is reduced to 6.0 µm or less. This Example therefore demonstrates that, if firing is performed within the range of 820° C.–860° C., Rmax can be reduced to 6.0 µm or less and, as a result, the occurrence of migration can be reduced.

As can be clearly seen from the comparison between the samples G and I, the sample G obtained through firing in a humidity of up to 20% at room temperature shows a higher Rmax at the electrode interface and accordingly a higher incidence of migration occurrence. This is probably because firing in a low humidity of up to 20% at room temperature increases a static charge between electrodes and subsequent discharging causes migration of Ag that results in an increase in magnitude of irregularities at the electrode interface. Therefore, Rmax can be reduced to 6.0 µm or less in a controlled way by increasing a humidity at which firing is performed.

As can also be clearly seen from the comparison between the samples H and I, the lower viscosity of the Ag paste results in increasing Rmax at the electrode interface and an incidence of migration occurrence. This is probably because if the Ag paste has a lower viscosity when printed to form a wiring, it penetrates deeper or wider in the green sheet to result in the larger irregularities at the electrode interface. Therefore, it will be apparent that Rmax can be reduced to 6.0 µm or less by increasing a viscosity of the Ag paste.

EXAMPLE 2

The procedure of Example 1 was followed to prepare multilayer ceramic substrates each having a portion where the electrode layers had the overlapping area and spacing specified in Table 2. Firing was performed at 880° C. and 850° C. The Ag paste having a viscosity of 320 Pas was printed to form a wiring. Firing was performed in a humidity of 60% at room temperature.

For the substrates obtained through firing at 880° C. and 850° C., an incidence of migration occurrence in the overlapping region of each electrode layer was evaluated in the same manner as in Example 1. The results are shown in Table 2.

TABLE 2

| Overlapping Area (mm²) | Spacing (µm) | Incidence of Migration Occurrence | |
|---|---|---|---|
| | | Product(fired at 880° C.) | Product(fired at 850° C.) |
| 0.045 | 30 | 16%(7/43) | 0%(0/30) |
| 0.08 | 60 | 7%(2/30) | 0%(0/30) |
| 0.08 | 30 | 7%(2/30) | 0%(0/30) |
| 0.12 | 60 | 7%(2/30) | 0%(0/30) |
| 0.4 | 30 | 7%(2/30) | 0%(0/30) |
| 0.7 | 30 | 0%(0/30) | 0%(0/30) |

As can be clearly seen from the results shown in Table 2, in the multilayer ceramic substrates obtained through firing at a conventional firing temperature of 880° C., migration occurs in the overlapping region having an area of 0.4 mm² or smaller. On the contrary, in the multilayer ceramic substrates obtained through firing at a firing temperature of 850° C., in accordance with the present invention, no migration occurs even in the overlapping region having an area of 0.4 mm² or smaller.

In accordance with the present invention, the occurrence of migration can be reduced even in the overlapping region having an area of 0.4 mm² or smaller. Therefore, the present invention enables size reduction and density increase of a multilayer ceramic substrate.

In the preceding Examples, the glass-ceramic material was described to contain alumina as a ceramic component. The present invention is not limited to such a composition of the glass-ceramic material. Titanium oxide or an oxide of calcium titanate, barium titanate or the like may be contained as the ceramic component, for example. Also, examples of useful glass components include various compositions of borosilicate glass, zinc glass, bismuth glass, feldspar glass, cordierite glass and diopside glass.

What is claimed is:

1. A method for manufacturing a multilayer ceramic substrate by firing multilayers of ceramic green sheets each having a dielectric layer made of a glass-ceramic material and an electrode layer made of silver and formed on the dielectric layer, characterized as comprising the steps of:
    providing multilayers of ceramic green sheets each having an electrode layer formed on a dielectric layer such that, after firing, at least one said electrode layer which is separated by the dielectric layer from the adjacent electrode layer in the substrate has an overlapping area of 0.4 mm² or smaller with the adjacent electrode; and
    firing said multilayers of the ceramic green sheets at a selected temperature such that, after firing, an interface between said dielectric layer and said electrode layer in the substrate has irregularities with a roughness Rmax of 6 µm or less per 100 µm standard length and the dielectric layer has a saturation sintered density.

2. A multilayer ceramic substrate characterized in that it is obtained by the method as recited in claim 1.

3. The method according to claim 1, comprising firing said multilayers at a temperature of 820° C. to 860° C.

4. The method according to claim 1, wherein said glass-ceramic material is composed of a ceramic component and a glass component.

5. The method according to claim 4, wherein said ceramic component is at least one selected from the group consisting of alumina, titanium oxide, calcium titanate and barium titanate, and said glass component is at least one selected from the group consisting of borosilicate glass, zinc glass, bismuth glass, feldspar glass, cordierite glass and diopside glass.

6. A multilayer ceramic substrate obtained by firing multilayers of ceramic green sheets each having a dielectric layer made of a glass ceramic material and an electrode layer made of silver and formed on the dielectric layer, characterized in that an interface between the dielectric layer and the electrode layer has irregularities with a roughness Rmax of up to 6 µm per 100 µm standard length and at least one said electrode layer separated by the dielectric layer from the adjacent electrode layer has an overlapping area of 0.4 mm² or smaller with the adjacent electrode.

* * * * *